United States Patent [19]

Goerne et al.

[11] 4,403,159
[45] Sep. 6, 1983

[54] CIRCUIT FOR EVALUATING SIGNALS

[75] Inventors: Jan Goerne; Wilfried Traulsen, both of Munich, Fed. Rep. of Germany

[73] Assignee: Siemens Aktiengesellschaft, Berlin & Munich, Fed. Rep. of Germany

[21] Appl. No.: 297,788

[22] Filed: Aug. 31, 1981

[30] Foreign Application Priority Data

Nov. 14, 1980 [DE] Fed. Rep. of Germany ....... 3043053

[51] Int. Cl.³ .................... H03K 5/153; H03K 5/24
[52] U.S. Cl. .................................. 307/362; 307/360; 328/146
[58] Field of Search ............... 307/117, 311, 360, 362, 307/268; 328/146, 147

[56] References Cited

U.S. PATENT DOCUMENTS 3,989,959 11/1976 Renirie et al. ..................... 307/360
4,075,507 2/1978 Pauli et al. ........................ 307/117
4,219,839 8/1980 Watanabe ........................... 307/362

Primary Examiner—John Zazworsky
Attorney, Agent, or Firm—Hill, Van Santen, Steadman & Simpson

[57] ABSTRACT

A circuit for evaluating signals has an operational amplifier and a comparator, both of which are supplied by a voltage source connected to ground at one side. The reference inputs of the amplifier and comparator are respectively connected to different taps of a voltage divider also connected across the voltage source, the taps being separated by a low-resistance resistor, thus attaining a stable zero signal level at the signal input of the comparator in the quiescent state through the non-inverting input of the operational amplifier and the output thereof, the stable zero signal level exhibiting a constant voltage difference in comparison to the reference potential at the reference input of the comparator.

2 Claims, 1 Drawing Figure

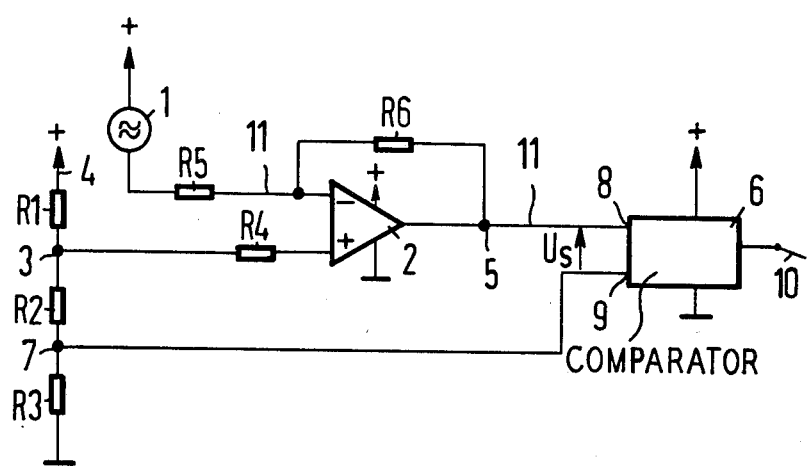

CIRCUIT FOR EVALUATING SIGNALS

BACKGROUND OF THE INVENTION

1. Field of the Invention

The present invention relates to a circuit for evaluating signals and in particular a circuit having a comparator with one input connected to a signal line and the other input connected to a circuit node supplying a reference potential to the comparator which is formed by a tap of an ohmic voltage divider connected to ground at one side, and an amplifier interconnected between the signal line and the comparator.

2. Description of the Prior Art

A circuit arrangement for evaluating signals such as output signals of optical measuring devices is known from U.S. Pat. No. 4,075,507 corresponding to German AS 26 08 206 wherein a measuring device is connected to one input of a comparator and which includes a voltage divider having a tap connected to the other input of the comparator. A storage capacitor is connected to the tap of the voltage divider and to the other input of the comparator so as to provide a reference voltage which has a fixed relation to the signal voltage from the measuring device in the quiescent state. The voltage divider employed in this arrangement for the formation of the reference potential is disposed between ground and the signal line, and the capacitor is connected between the reference input of the comparator and ground, so that the reference potential is determined by the charge state of the capacitor which is charged by means of the voltage divider tap. In this device it is assumed that only such signals will be present on the signal line which result in a rapid and sufficiently large signal level change so that the reference potential for conducting the signal evaluation remains substantially unchanged as a result of the relatively high charging time constant. For signals of longer duration, however, the charging of the capacitor would be influenced by the other signal lines level and the signal evaluation would thus be falsified. It is therefore provided in this conventional arrangement to switch the capacitor to an auxiliary voltage source for the evaluation of such a signal by the use of a switch driven by the comparator output signal and to thus prevent a resetting of the comparator for a long duration. Thus, a stable reference potential at the signal zero level is made available to the reference input of the comparator, however, relatively complex circuit outlay is required to maintain the circuit arrangement operational for all signal shapes and durations.

SUMMARY OF THE INVENTION

It is an object of the present invention to provide a circuit for evaluating signals of the type described above such that a stable reference potential is automatically maintained at the zero signal level at the reference input of the comparator without the necessity of a switch or comparable device driven by the output signal of the comparator.

The above object is inventively achieved by the use of an operational amplifier which is supplied, as is the comparator, by only one voltage source connected to ground at one side. The non-inverting input of the amplifier is connected to a further tap of the voltage divider and the inverting input of the amplifier is connected to the signal line. The voltage divider is connected at one side to the pole of the voltage source which is not connected to ground and consists of three ohmic resistors connected in series. The taps of the voltage divider lie at each side of the center resistor and the center resistor has a resistance value, which determines the threshold value of the comparator, which is significantly smaller than the sum of the resistance values of the other two voltage divider resistors.

Because of the use of the operational amplifier as the signal amplifier in front of the comparator, the potential of the voltage divider tap which is connected to the non-inverting input of this amplifier will be reflected at the output of the amplifier and thus become effective at the signal input of the comparator when no signal is present at the inverting input of the operational amplifier. The potential relationship at the two inputs of the comparator is thus essentially determined by the potential difference between the two voltage divider taps and is moreover substantially stable even in the presence of a relatively fluctuating voltage of the voltage source. This stability results from the low-resistance dimensioning of the center resistor separating the taps in comparison to the high resistance of the overall voltage divider. When the inverting input of the operational amplifier is charged with a signal, the signal level will rise to the potential of the tap which is at a greater distance from the grounded side of the voltage divider. This assures that the signal evaluation will be undertaken largely independent of the voltage of the voltage source, which may fluctuate, and of the semiconductor components employed in the circuit which may fluctuate due to temperature changes. The voltage threshold at the comparator can thus be very low and a maximum sensitivity can be achieved for signal evaluation.

In a further embodiment of the invention a signal source with a high internal resistance is employed and the operational amplifier has a feedback resistor interconnected between the output and the inverting input of the amplifier, the feedback resistor having a resistance value which is equal to the resistance value of the resistor disposed between the non-inverting input of the operational amplifier and the voltage divider tap connected thereto. By this arrangement, the operational amplifier is in the form of a so-called transimpedance amplifier, that is, the voltage gain is approximately equal to unity. The off-set current and the off-set voltage of the amplifier at the output side thus result in only a negligible level change of a few millivolts which has essentially no influence on the comparator given a threshold voltage for the comparator of approximately 60 millivolts.

DESCRIPTION OF THE DRAWINGS

The single FIGURE is a circuit diagram for a circuit for evaluating signals constructed in accordance with the principles of the present invention.

DESCRIPTION OF THE PREFERRED EMBODIMENTS

As shown in the single drawing, a circuit for evaluating signals has a signal source 1 which has a relatively high internal resistance, separately designated as R5. The signal source 1 is connected to the inverting input of an operational amplifier 2 and is connected at its opposite side to a feed voltage source (not illustrated).

The operational amplifier 2 is supplied by a voltage source connected to ground at one side and which, for example, may be the same voltage source to which the signal source 1 is connected. The voltage source has a voltage, for example, of five volts and is connected to ground at its negative pole.

The non-inverting input of the operational amplifier 2 is connected through a resistor R4 to a tap 3 of a voltage divider 4 consisting of three resistors R1, R2 and R3 connected in series. The voltage divider 4 is also connected across the feed voltage source with one side thereof at ground, and the tap 3 is at one of two possible tap locations, the tap 3 being at the larger distance from the grounded side of the divider 4.

A negative feedback resistor R6, having a value equal to the resistor R4, is interconnected between the output 5 of the operational amplifier 2 and the inverting input thereof. A symmetrical operating mode of the operational amplifier is thus achieved in comparison to the quiescent level of the amplifier at the output side.

The output 5 of the operational amplifier 2 is further connected to a signal input 8 of a comparator 6. The comparator 6 has a reference input 9 which is connected to a tap 7 of the divider 4. The comparator 6 is also supplied by the operating voltage source (not illustrated).

The resistor R2 which is connected between the taps 3 and 7 in the divider 4 has a relatively low resistance value in comparison to the overall resistance value of the voltage divider which is generally high. The voltage drop at the resistor R2 is thus substantially stable even if the feed voltage source exhibits fluctuations.

In the absence of a signal on the signal line 11, that is, a signal current substantially equal to zero, the potential at the output 5 of the operational amplifier 2 is essentially equal to the potential at the tap 3 of the voltage divider 4. This potential thus also lies at the signal input 8 of the comparator 6.

The reference input 9 of the comparator, in contrast thereto, exhibits the potential of the tap 7 of the voltage divider 4. By means of a suitable dimensioning of the resistor R2, a potential difference is obtained between the two inputs of the comparator 6 which defines the threshold voltage $U_s$ of the comparator 6.

A signal emitted by the signal source 1 floats at the potential of the tap 3 of the voltage divider 4, so that every signal derived from the signal source 1 must, as a result of the stable threshold voltage of the comparator 6, exhibit a minimum level which overcomes the threshold voltage. The threshold voltage may be, for example, 60 millivolts. This is the signal required to obtain an output signal from the comparator. Because of the stability of the voltage difference between the taps 3 and 7 of the voltage divider 4, the threshold voltage can be dimensioned very small so that the signal evaluation circuit has a high sensitivity. As a result, the duration of the signal from the signal source 1 does not effect evaluation of the signal by the circuit disclosed herein. For the duration of a signal on the signal line 11, the output 10 of the comparator 6 changes from a first to a second voltage state, thus indicating the existence of a signal from the signal source 1.

An exemplary embodiment of the above-described circuit can be realized with the following suggested component specifications: R1 being approximately 510 ohms; R2 being approximately 27 ohms; R3 being approximately 750 ohms; R4 being approximately 100 kilo-ohms; R5 being approximately 1 mega-ohms; R6 being approximately 100 kilo-ohms; the operational amplifier 2 being of the type TCA 325 manufactured by Siemens; the comparator 6 being of the type LM 311 manufactured by Texas Instruments; and the signal source 1 being of the type SFH 202 manufactured by Siemens.

Although modifications and changes may be suggested by those skilled in the art it is the intention of the inventors to embody within the patent warranted hereon all changes and modifications as reasonably and properly come within the scope of their contribution to the art.

We claim as our invention:

1. A circuit for evaluating signals comprising:
   a comparator having a signal input connected to a signal line for receiving signals to be evaluated from a signal source and having a reference input, said comparator being supplied by a voltage source which has one side thereof grounded;
   an ohmic voltage divider consisting of three resistors connected across said voltage source, one of said three resistors being a center resistor and having a first voltage divider tap disposed on a side thereof farther from ground and a second voltage divider tap disposed on a side thereof closer to ground, said center resistor having a resistance value which is substantially less than the total resistance value of said voltage divider, said reference input of said comparator being connected to said second voltage divider tap for fixing the threshold voltage of said comparator; and
   an operational amplifier supplied by said voltage source and having an output connected to said signal input of said comparator and an inverting input connected to said signal source and a non-inverting input connected to said first voltage divider tap for providing a stable reference potential for said comparator.

2. The circuit of claim 1 wherein said signal source has a high internal resistance and further comprising a negative feedback resistor interconnected between the output and the inverting input of said operational amplifier, and an additional resistor interconnected between the non-inverting input of the operational amplifier and the first voltage divider tap, said negative feedback resistor and said additional resistor having the same resistance value.

* * * * *